US012790539B2

(12) United States Patent
Lee et al.

(10) Patent No.: US 12,790,539 B2
(45) Date of Patent: Nov. 10, 2026

(54) SURFACE TREATMENT METHOD OF QUANTUM DOTS, LIGHT-EMITTING DEVICE INCLUDING SURFACE-TREATED QUANTUM DOTS, AND DISPLAY DEVICE INCLUDING LIGHT-EMITTING DEVICE

(71) Applicant: Samsung Display Co., LTD., Yongin-si (KR)

(72) Inventors: Sooho Lee, Yongin-si (KR); Yunhyuk Ko, Yongin-si (KR); Seonhui Baek, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 314 days.

(21) Appl. No.: 18/535,254

(22) Filed: Dec. 11, 2023

(65) Prior Publication Data

US 2024/0199949 A1 Jun. 20, 2024

(30) Foreign Application Priority Data

Dec. 16, 2022 (KR) ........................ 10-2022-0176998

(51) Int. Cl.
*C09K 11/06* (2006.01)
*H10K 50/115* (2023.01)
*H10K 50/16* (2023.01)

(52) U.S. Cl.
CPC ............ *C09K 11/06* (2013.01); *H10K 50/115* (2023.02); *H10K 50/16* (2023.02)

(58) Field of Classification Search
CPC ....... C09K 11/06; H10K 50/115; H10K 71/00
See application file for complete search history.

(56) References Cited

U.S. PATENT DOCUMENTS

| | | | | |
|---|---|---|---|---|
| 11,011,721 | B2 | 5/2021 | Kim et al. | |
| 2018/0151817 | A1* | 5/2018 | Cho | H10K 50/115 |
| 2019/0081263 | A1* | 3/2019 | Park | H10K 50/115 |
| 2020/0249388 | A1 | 8/2020 | Dubrow et al. | |
| 2020/0266373 | A1* | 8/2020 | Kim | H10K 50/171 |

(Continued)

FOREIGN PATENT DOCUMENTS

| | | |
|---|---|---|
| KR | 10-2019-0106824 | 9/2019 |
| KR | 10-2021-0028411 | 3/2021 |

(Continued)

OTHER PUBLICATIONS

Xiaoyong Liang et al., "Colloidal Metal Oxide Nanocrystals as Charge Transporting Layers for Solution-processed Light-emitting Diodes and Solar Cells", Royal Society of Chemistry, Chem. Soc. Rev., 2017, vol. 46, pp. 1730-1759, DOI: 10.1039/c6cs00122j, Feb. 28, 2017 (Total 30 pages).

(Continued)

*Primary Examiner* — Nduka E Ojeh
(74) *Attorney, Agent, or Firm* — CANTOR COLBURN LLP

(57) ABSTRACT

A light-emitting device includes a first electrode, an electron transport layer disposed on the first electrode, a light-emitting layer disposed on the electron transport layer, a hole transport layer disposed on the light-emitting layer, and a second electrode disposed on the hole transport layer. The light-emitting layer includes quantum dots, and metal thiolate carboxylate ligands are disposed on surfaces of the quantum dots.

16 Claims, 6 Drawing Sheets

(56) References Cited

U.S. PATENT DOCUMENTS

| | | | | |
|---|---|---|---|---|
| 2020/0335715 | A1* | 10/2020 | Chung | H10K 71/441 |
| 2021/0066422 | A1* | 3/2021 | Gong | H10K 59/1213 |
| 2021/0135139 | A1* | 5/2021 | Lee | H10K 50/13 |
| 2021/0189233 | A1* | 6/2021 | Jung | C09K 11/025 |
| 2021/0371739 | A1* | 12/2021 | Lee | C09K 11/08 |
| 2021/0380878 | A1* | 12/2021 | Peng | C09K 11/883 |
| 2022/0204799 | A1 | 6/2022 | Kim et al. | |
| 2024/0224560 | A1* | 7/2024 | Wang | H10K 71/00 |

FOREIGN PATENT DOCUMENTS

| | | |
|---|---|---|
| KR | 10-2021-0048786 | 5/2021 |
| KR | 10-2022-0095393 | 7/2022 |
| KR | 10-2420787 | 7/2022 |

OTHER PUBLICATIONS

S. Wei et al., "Thin-Shell CdSe/ZnCdS Core/Shell Quantum Dots and Their Electroluminescence Device Application", Journal of Materials Chemistry C, Royal Society of Chemistry, pp. 1-27, DOI: 10.1039/C8TC03906B, Sep. 12, 2018 (Total 29 pages).

Korean Office Action for Korean Patent Application No. 10-2022-0176998, dated Nov. 14, 2024.

* cited by examiner

SURFACE TREATMENT METHOD OF QUANTUM DOTS, LIGHT-EMITTING DEVICE INCLUDING SURFACE-TREATED QUANTUM DOTS, AND DISPLAY DEVICE INCLUDING LIGHT-EMITTING DEVICE

CROSS REFERENCE TO RELATED APPLICATION(S)

This application claims priority to and benefits of Korean Patent Application No. 10-2022-0176998 under 35 U.S.C. § 119, filed on Dec. 16, 2022, in the Korean Intellectual Property Office (KIPO), the entire contents of which are incorporated herein by reference.

BACKGROUND

1. Technical Field

The disclosure relates to a surface treatment method of quantum dots, a light-emitting device including surface-treated quantum dots, and a display device including a light-emitting device.

2. Description of the Related Art

A light-emitting device includes an anode, a cathode, and a light-emitting layer formed between the anode and the cathode, and as excitons generated by combining holes injected from the anode and electrons injected from the cathode in the light-emitting layer are changed to a ground state from an excited state and release energy, light is emitted.

Since the light-emitting device may be driven with low voltage, configured to be lightweight and thin, and have excellent characteristics such as viewing angle, contrast, response speed, and the like, a range of applications of the light-emitting device is increasing from a personal portable device to a television (TV).

Quantum dots are used in a light-emitting layer of the light-emitting device. The quantum dot (QD) is a semiconductor nanoparticle. The quantum dots with a diameter of nanometers emit light as electrons in an unstable state fall from a conduction band to a valence band, and the smaller quantum dot particles, the shorter wavelength light is generated, whereas the larger quantum dot particles, the longer wavelength light is generated. Wavelength difference of the light according to a size of a quantum dot particle is a unique electrical and optical characteristic, and the quantum dot and conventional semiconductor materials have different characteristics. Therefore, by adjusting a size of the quantum dots, visible light of a desired wavelength may be displayed, and various colors may be simultaneously realized by varying quantum dots of various sizes and quantum dot components.

The above information disclosed in this Background section is only for enhancement of understanding of the background of the disclosure, and therefore it may contain information that does not form the prior art that is already known in this country to a person of ordinary skill in the art.

SUMMARY

Embodiments are to provide a light-emitting device including quantum dots with improved film uniformity by surface treatment and a display device including the light-emitting device.

According to an embodiment, a light-emitting device may include a first electrode, an electron transport layer disposed on the first electrode, a light-emitting layer disposed on the electron transport layer, a hole transport layer disposed on the light-emitting layer, and a second electrode disposed on the hole transport layer. The light-emitting layer may include quantum dots, and metal thiolate carboxylate ligands may be disposed on surfaces of the quantum dots.

A metal in the metal thiolate carboxylate ligands may be at least one of In, Zn, Mg, Ti, Ga, Al, Sn, Cu, and Ag.

A thiolate in the metal thiolate carboxylate ligands may be at least one of methane thiol, ethane thiol, propane thiol, butane thiol, pentane thiol, hexane thiol, octane thiol, dodecane thiol, hexadecane thiol, octadecane thiol, and benzyl thiol.

A carboxylate in the metal thiolate carboxylate ligands may be at least one of a methane acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid.

The electron transport layer may include at least one of ZnO, $TiO_2$, $WO_3$, $SnO_2$, and ZnO, $TiO_2$, $WO_3$, and $SnO_2$ doped with at least one of Mg, Y, Li, Ga, and Al.

The electron transport layer may include a hydroxyl group or ethylene glycol.

The quantum dot may include a group III-V nano-semiconductor compound.

The quantum dot may include at least one of GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The first electrode may be a reflective electrode, and the second electrode may be a transflective electrode.

According to an embodiment, a surface treatment method of quantum dots may include forming a mixture of a metal precursor, a carboxylic acid, and a thiol, heating the mixture at a temperature of higher than or equal to about 230° C. to form a metal thiolate carboxylate, and substituting ligands by introducing quantum dots into the metal thiolate carboxylate.

The metal precursor may include at least one of In, Zn, Mg, Ti, Ga, Al, Sn, Cu, and Ag.

The carboxylic acid may be at least one of a methane acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid.

The thiol may be at least one of methane thiol, ethane thiol, propane thiol, butane thiol, pentane thiol, hexane thiol, octane thiol, dodecane thiol, hexadecane thiol, octadecane thiol, and benzyl thiol.

According to an embodiment, a display device may include a transistor disposed on a substrate, and a light-emitting device electrically connected to the transistor. The light-emitting device may include a first electrode, an electron transport layer disposed on the first electrode, a light-emitting layer disposed on the electron transport layer, a hole transport layer disposed on the light-emitting layer, and a second electrode disposed on the hole transport layer. The light-emitting layer may include quantum dots, and metal thiolate carboxylate ligands may be disposed on surfaces of the quantum dots.

The transistor may be electrically connected to the first electrode of the light-emitting device.

A metal in the metal thiolate carboxylate ligands may be at least one of In, Zn, Mg, Ti, Ga, Al, Sn, Cu, and Ag.

A thiolate in the metal thiolate carboxylate ligands may be at least one of methane thiol, ethane thiol, propane thiol, butane thiol, pentane thiol, hexane thiol, octane thiol, dodecane thiol, hexadecane thiol, octadecane thiol, and benzyl thiol.

A carboxylate in the metal thiolate carboxylate ligands may be at least one of a methane acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid.

The electron transport layer may include at least one of ZnO, $TiO_2$, $WO_3$ $SnO_2$, and ZnO, $TiO_2$, $WO_3$, and $SnO_2$ doped with at least one of Mg, Y, Li, Ga, and Al.

The first electrode may be a reflective electrode, and the second electrode may be a transflective electrode.

According to embodiments, it is possible to provide a light-emitting device including quantum dots with improved film uniformity by surface treatment and a display device including the light-emitting device.

DETAILED DESCRIPTION OF THE EMBODIMENTS

Figure 1:
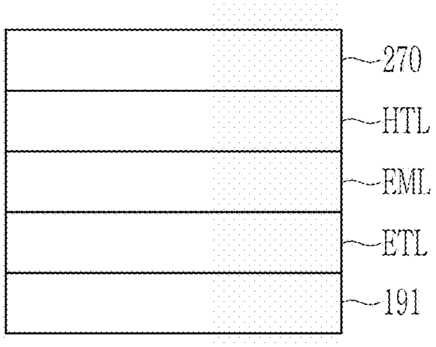
FIG. 1 is a schematic cross-sectional view of a light-emitting device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

In order to clearly describe the disclosure, parts or portions that are irrelevant to the description are omitted, and identical or similar constituent elements throughout the specification are denoted by the same reference numerals.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the drawings, the size and thickness of each element are arbitrarily illustrated for ease of description, and the disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction. When an element, such as a layer, is referred to as "connected to," or "coupled to" another element or layer, it may be directly on, connected to, or coupled to the other element or layer or intervening elements or layers may be present. Also, when an element is referred to as being "in contact" or "contacted" or the like to another element, the element may be in "electrical contact" or in "physical contact" with another element; or in "indirect contact" or in "direct contact" with another element.

The terminology used herein is for the purpose of describing particular embodiments and is not intended to be limiting. As used herein, the singular forms, "a," "an," and "the" are intended to include the plural forms as well, unless the context clearly indicates otherwise. Unless explicitly described to the contrary, the word "comprise," "include," and variations such as "comprises," "comprising," "includes," or "including" will be understood to imply the inclusion of stated features, integers, steps, operations, elements components, and/or groups thereof, but not the exclusion of any other elements. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a light-emitting device including quantum dots, a surface treatment method of quantum dots, and a display device including a light-emitting device according to an embodiment will be described in detail.

FIG. 1 is a schematic cross-sectional view of a light-emitting device according to an embodiment. Referring to FIG. 1, a light-emitting device may include a first electrode 191, an electron transport layer ETL, a light-emitting layer EML, a hole transport layer HTL, and a second electrode 270.

The first electrode 191 and the second electrode 270 may include a conductive oxide such as an indium tin oxide (ITO), an indium zinc oxide (IZO), a zinc tin oxide (ZTO), a copper indium oxide (CIO), a copper zinc oxide (CZO), a gallium zinc oxide (GZO), an aluminum zinc oxide (AZO), a tin oxide ($SnO_2$), a zinc oxide (ZnO), the like, or a combination thereof; calcium (Ca), ytterbium (Yb), aluminum (Al), silver (Ag), magnesium (Mg), samarium (Sm), titanium (Ti), gold (Au), the like, or an alloy thereof; graphene, carbon nanotubes; or a conductive polymer such as PEDOT:PSS, or the like. However, the first electrode 191 and the second electrode 270 are not limited thereto, and may be formed in a stacked structure of two or more layers.

In an embodiment, the first electrode 191 may be a reflective electrode having a structure of ITO/Ag/ITO, and the second electrode 270 may be a transflective electrode including AgMg. Light generated from the light-emitting layer EML may be reflected by the first electrode 191, which is a reflective electrode, and may be resonated between the second electrode 270, which is a transflective electrode, and the first electrode 191 to be amplified. The resonated light may be reflected from the first electrode 191 and emitted to a surface (e.g., an upper surface) of the second electrode 270.

In another embodiment, the second electrode 270 may be a reflective electrode having a structure of ITO/Ag/ITO, and the first electrode 191 may be a transflective electrode including AgMg. Light generated from the light-emitting layer EML may be reflected by the second electrode 270, which is a reflective electrode, and may be resonated between the first electrode 191, which is a transflective electrode, and the second electrode 270 to be amplified. The resonated light may be reflected from the second electrode 270 and emitted to a surface (e.g., an upper surface) of the first electrode 191.

The hole transport layer HTL may include at least one of m-MTDATA, TDATA, 2-TNATA, NPB(NPD), β-NPB, TPD, Spiro-TPD, Spiro-NPB, methylated-NPB, TAPC, HMTPD, TCTA(4,4',4"-tris(N-carbazolyl)triphenylamine), Pani/DBSA(Polyaniline/Dodecylbenzenesulfonic acid), PEDOT/PSS(Poly(3,4-ethylenedioxythiophene)/Poly(4-styrenesulfonate)), Pani/CSA (Polyaniline/Camphor sulfonic acid), and PANI/PSS (Polyaniline/Poly(4-styrenesulfonate)). In another embodiment, the hole transport layer HTL may include an alkali metal halide, an alkaline earth metal halide, or the like.

The electron transport layer ETL may include a material selected from the group consisting of ZnO, $TiO_2$, $WO_3$, $SnO_2$; and ZnO, $TiO_2$, $WO_3$, and $SnO_2$ doped with at least one of Mg, Y, Li, Ga, and Al. The electron transport layer ETL may include a hydroxyl group, ethylene glycol, or the like.

The light-emitting layer EML may include quantum dots. For example, the quantum dot may include at least one of Zn, Te, Se, Cd, In, and P. The quantum dot may include a core including at least one of Zn, Te, Se, Cd, In, and P, and a shell disposed on at least a portion of the core and having a composition. The composition of the shell and a composition of the core may be different.

For example, the quantum dot may include a group II-VI compound, a group I-III-VI compound, a group III-V compound, a group IV-VI compound, a group IV element, a group IV compound, or a combination thereof.

In the quantum dot, the group II-VI compound may be selected from the group consisting of a binary compound such as CdSe, CdTe, CdS, ZnS, ZnSe, ZnTe, ZnO, HgS, HgSe, HgTe, MgSe, MgS, and a mixture thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

In the quantum dot, the group I-III-VI compound may be selected from the group consisting of a ternary compound such as AgInS, CuInS, AgGaS, CuGaS, and a mixture thereof; and a quaternary compound such as AgInGaS, and CuInGaS.

The group III-V compound may be selected from the group consisting of a binary compound such as GaN, GaP, GaAs, GaSb, AlN, AlP, AlAs, AlSb, InN, InP, InAs, InSb, and a mixture thereof; a ternary compound such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In an embodiment, the group III-V compound may further include a group II metal (for example, InZnP) or a compound of the group II metal.

The group IV-VI compound may be selected from the group consisting of a binary compound such as SnS, SnSe, SnTe, PbS, PbSe, PbTe, and a mixture thereof; a ternary compound such as SnSeS, SnSeTe, SnSTe, PbSeS, PbSeTe, PbSTe, SnPbS, SnPbSe, SnPbTe, and a mixture thereof; and a quaternary compound such as SnPbSSe, SnPbSeTe, SnPbSTe, and a mixture thereof. The group IV element may be selected from the group consisting of Si, Ge, and a mixture thereof; and a binary element compound such as SiC, SiGe, and a mixture thereof.

The quantum dot according to an embodiment may include a ligand on a surface of the quantum dot. The ligand may be a metal thiolate carboxylate. The metal may be at least one of In, Zn, Mg, Ti, Ga, Al, Sn, Cu, and Ag. The thiolate may be at least one of methane thiol, ethane thiol, propane thiol, butane thiol, pentane thiol, hexane thiol, octane thiol, dodecane thiol, hexadecane thiol, octadecane thiol, and benzyl thiol. The carboxylate may be at least one of a methane acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid.

The surface-modified quantum dots with metal thiolate carboxylate ligands may form a film (e.g., a uniform film) during a manufacturing process. As shown in FIG. 1, the light-emitting layer EML including quantum dots may be formed on the electron transport layer ETL by Inkjet printing. A film formation (e.g., a thin film formation) by the Inkjet printing may be influenced by a ligand of the electron transport layer ETL and a ligand of the light-emitting layer EML, and in an embodiment, since the surface of the quantum dots is treated with metal thiolate carboxylate ligand, a uniform light-emitting layer thin film may be formed.

Hereinafter, a surface treatment method and effect of quantum dots according to an embodiment will be described.

The surface treatment method of the quantum dots according to an embodiment may include forming a mixture of a metal precursor, a carboxylic acid, and a thiol, heating the mixture at a temperature of higher than or equal to about 230° C. to convert the mixture into a metal thiolate carboxylate (or to form a metal thiolate carboxylate), and substituting a ligand by introducing quantum dots into the metal thiolate carboxylate.

As described above, the metal precursor may be at least one of In, Zn, Mg, Ti, Ga, Al, Sn, Cu, and Ag. The carboxylic acid may be at least one of a methane acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid. The thiolate (or thiol) may be at least one of methane thiol, ethane thiol, propane thiol, butane thiol, pentane thiol, hexane thiol, octane thiol, dodecane thiol, hexadecane thiol, octadecane thiol, and benzyl thiol.

A reaction temperature for the formation of the metal thiolate carboxylate may be higher than or equal to about 230° C. Although it will be separately described below, in case that the reaction temperature is less than about 230° C., the surface treatment of the quantum dots may not be sufficiently performed, so an aggregation rate of the quantum dots may increase and a uniform thin film may not be obtained.

The effects of the disclosure will be described below.

Example 1: Zinc Thiolate Oleate Surface Treatment (Zn Thiolate Oleate Complex, about 270° C.)

About 0.25 mmol of zinc acetate, about 0.5 mmol of oleic acid, about 1 mmol of 1-dodecanethiol, and about 5 ml of trioctylamine were put into a three-necked flask, and impurities were removed at about 120 É by switching to a vacuum state. The temperature was raised to about 270° ° C. to form zinc thiolate oleate. Thereafter, about 5 ml of previously prepared 80 mg/ml InP/ZnSe/ZnS quantum dots were injected to perform a ligand substitution reaction for about 5 minutes. After cooling to room temperature, the quantum dots were purified twice with ethanol to remove impurities.

Comparative Example 1: DDT (about 30° C.)

At room temperature, about 1 mmol of 1-dodecanethiol was injected into about 5 ml of 80 mg/ml of InP/ZnSe/ZnS quantum dots, stirred for about 1 hour, and purified twice with ethanol.

Comparative Example 2: Zn $(OA)_2$ (about 270° C.)

Comparative Example 2 and Example 1 were prepared by a same method except for 1-dodecanethiol.

Comparative Example 3: DDT (about 270° C.)

Comparative Example 3 and Example 1 were prepared by a same method except for zinc acetate and oleic acid.

For the quantum dots prepared in Example 1 and Comparative Example 1 to Comparative Example 3, a light-emitting layer (e.g., a quantum dot light-emitting layer) was formed on the electron transport layer by an inkjet process, and the results are shown in Table 1 below. The electron transport layer, which is a lower film, includes ZnMgO, and the light-emitting layer, which is an upper film includes InP/ZnSe/ZnS quantum dots. The ligands disposed on the surface of each quantum dot are different for each example.

TABLE 1

| ETL (lower film) | EML (upper film) | Example | Ligand (reaction temperature) | Organic content | Aggre-gation rate |
|---|---|---|---|---|---|
| ZnMgO | QD | Example 1 | Zn thiolate oleate complex (about 270° C.) | about 13.8% | about 4% |
| | | Comparative Example 1 | DDT (about 30° C.) | about 11.5% | about 33% |
| | | Comparative Example 2 | Zn $(OA)_2$ (about 270° C.) | about 12.5% | about 22% |
| | | Comparative Example 3 | DDT (about 270° C.) | about 12.8% | about 22% |

Referring to the Table 1, it was confirmed that the organic content of the example was higher than the organic content of the comparative example (e.g., Comparative Examples 1 to 3), and the light-emitting layer EML of the Example 1 was formed as a uniform film. The aggregation rate was as low as about 4%.

Figure 2:
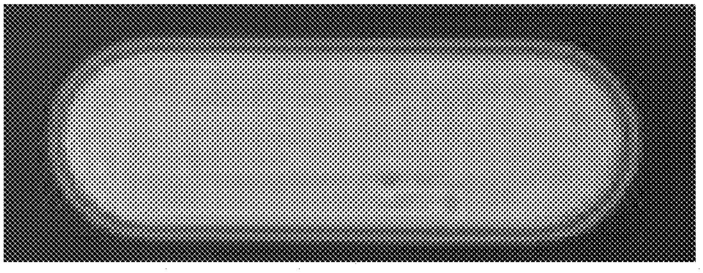
FIG. 2 is an image of a quantum dot of Example 1.
Figure 3:
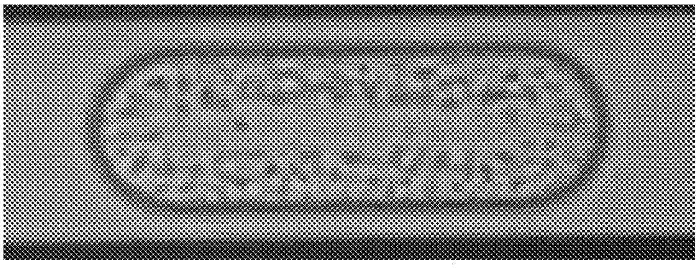
FIG. 3 is an image of a quantum dot of Comparative Example 1.
Figure 4:
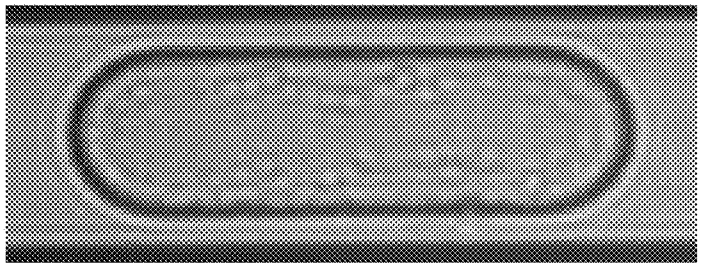
FIG. 4 is an image of a quantum dot of Comparative Example 2.
Figure 5:
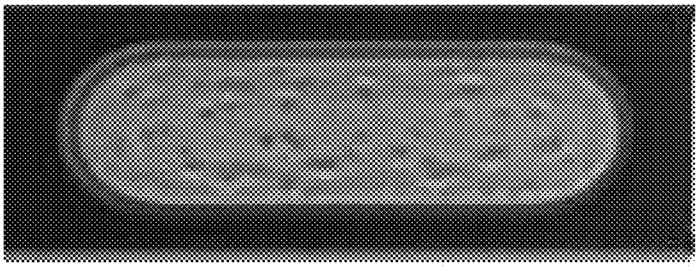
FIG. 5 is an image of a quantum dot of Comparative Example 3.

However, in Comparative Example 1 to Comparative Example 3, the organic content was lower than the organic content of the Example 1, and as shown in FIGS. 3 to 5, a uniform film was not formed and protrusions and depressions were observed as compared to Example 1 in FIG. 2. In Comparative Example 1 to Comparative Example 3, it was confirmed that the aggregation rate was also high in a range of about 22% to about 33%. Through this, it was confirmed that the surface-treated quantum dots with metal thiolate carboxylate ligands, as in the Example 1, has a high organic content and a low aggregation rate, and can form a uniform light-emitting layer film.

In case that the light-emitting layer EML is uniformly formed as described above, the current efficiency of the light-emitting device may be also increased.

Figure 6:
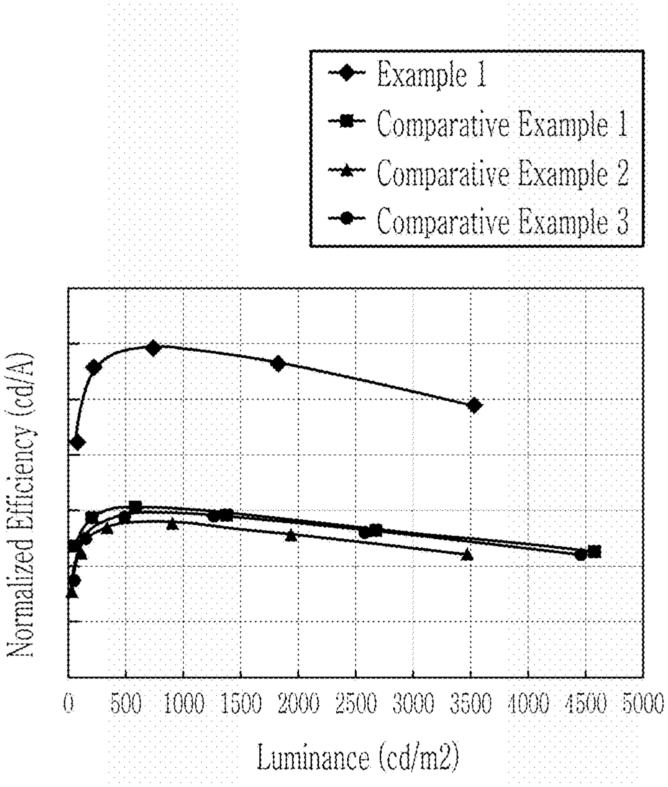
FIG. 6 is a schematic graph showing current efficiency of Example 1 and Comparative Examples 1 to 3.

FIG. 6 is a schematic graph showing current efficiency of Example 1 and Comparative Examples 1 to 3. Referring to FIG. 6, it was confirmed that Example 1 including quantum dots surface-treated with metal thiolate carboxylate ligands had improved current efficiency compared to Comparative Example 1 to Comparative Example 3.

Table 2 shows relative current efficiencies based on Example 1.

TABLE 2

| Example | Ligand (reaction temperature) | Relative current efficiency (Cd/A, Comparative Example n/Example 1) (n is 1, 2, or 3) |
|---|---|---|
| Example 1 | Zn thiolate oleate complex (about 270° C.) | 1 |
| Comparative Example 1 | DDT (about 30° C.) | about 0.51 |
| Comparative Example 2 | Zn $(OA)_2$ (about 270° C.) | about 0.48 |
| Comparative Example 3 | DDT (about 270° C.) | about 0.46 |

Referring to Table 2, it was confirmed that the current efficiency of Example 1 was about twice as high as the current efficiency of Comparative Example 1 to Comparative Example 3.

In the Example 1, the heating temperature for the formation of metal thiolate carboxylate is higher than or equal to about 230° C. Hereinafter, effects will be described.

Example 2

In Example 2, the heating temperature for forming zinc thiolate oleate was about 250° C. instead of about 270° C.

Comparative Example 4

In Comparative Example 4, the heating temperature for forming zinc thiolate oleate was about 200° ° C. instead of about 270° C.

Comparative Example 5

In Comparative Example 5, the heating temperature for forming zinc thiolate oleate was about 150° C. instead of about 270° C.

Quantum dot light-emitting layers of Example 2, Comparative Example 4, and Comparative Example 5 and the quantum dot light-emitting layer of Example 1 in Table 1 were formed by a same method, and the results are shown in Table 3 below. The relative current efficiencies compared to the current efficiency of Example 1 are also shown in Table 3.

TABLE 3

| ETL (lower film) | EML (upper film) | Example | Ligand (reaction temperature) | Organic content | Aggregation rate | Relative current efficiency (Cd/A, Comparative Example n/Example 1) (n is 4 or 5) |
|---|---|---|---|---|---|---|
| ZnMgO | QD | Example 1 | Zn thiolate oleate complex (about 270° C.) | about 13.8% | about 4% | 1 |
| | | Example 2 | Zn thiolate oleate complex (about 250° C.) | about 13.0% | about 6% | about 0.69 |
| | | Comparative Example 4 | Zn thiolate oleate complex (about 200° C.) | about 12.2% | about 17% | about 0.60 |
| | | Comparative Example 5 | Zn thiolate oleate complex (about 150° C.) | about 11.5% | about 20% | about 0.54 |

Figure 7:
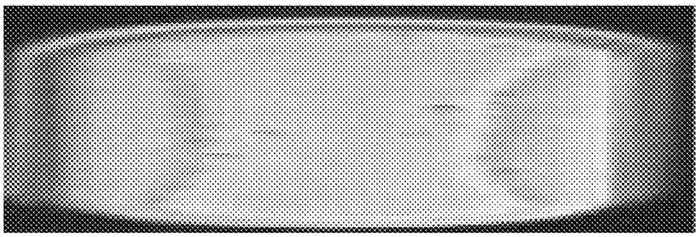
FIG. 7 is an image of a quantum dot of Example 2.

Referring to Table 3, in Example 1 and Example 2 with a heating temperature of higher than or equal to about 250° C., it was confirmed that the organic content was higher than the organic content of the Comparative Examples and the light-emitting layer was formed as a uniform film. It was confirmed that the organic content was higher than or equal to about 13%, the aggregation rate was less than or equal to about 10%, and a uniform surface was formed as shown in FIG. 7 as compared to FIGS. 8 and 9. The effect of Example 1, which was reacted at a higher temperature, was the best, and Example 2 also showed a high organic content, a low aggregation rate, a uniform surface, and a current efficiency corresponding to about 70% of Example 1.

Figure 8:
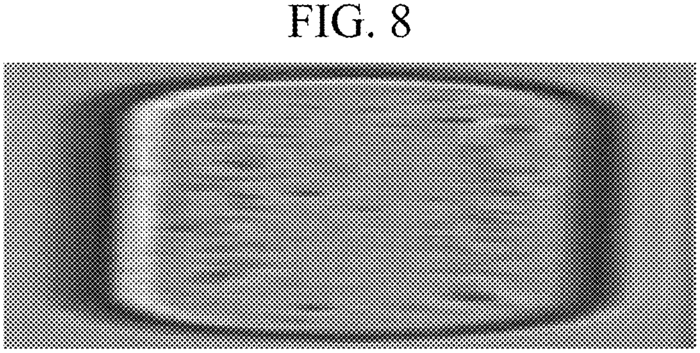
FIG. 8 is an image of a quantum dot of Comparative Example 4.
Figure 9:
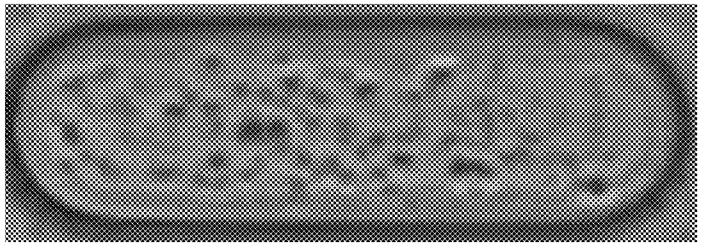
FIG. 9 is an image of a quantum dot of Comparative Example 5.
Figure 10:
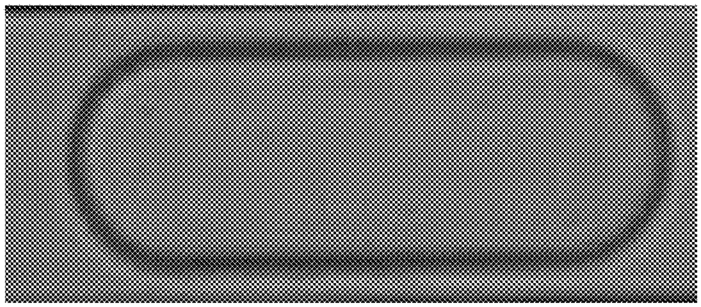
FIG. 10 is an image of a quantum dot of Example 3.
Figure 11:
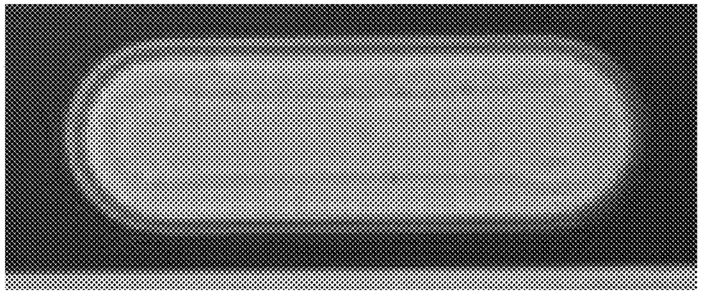
FIG. 11 is an image of a quantum dot of Example 4.
Figure 12:
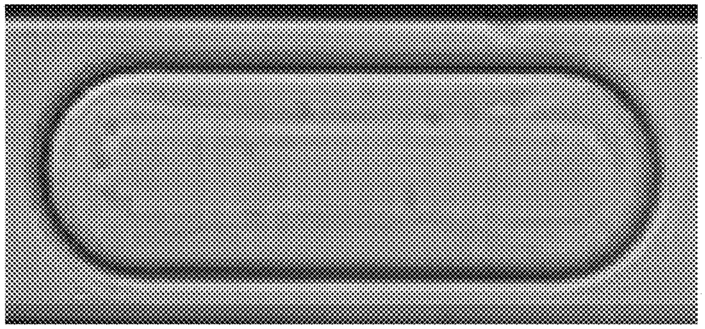
FIG. 12 is an image of a quantum dot of Example 5.
Figure 13:
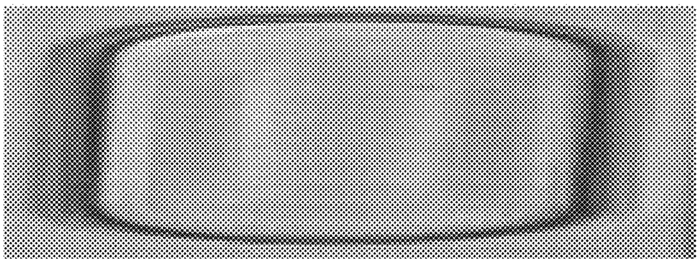
FIG. 13 is an image of a quantum dot of Example 6.
Figure 14:
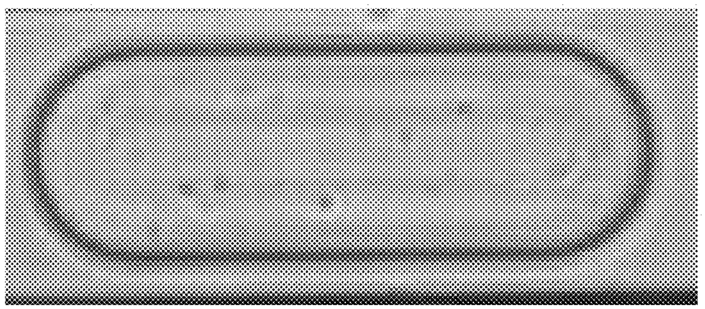
FIG. 14 is an image of a quantum dot of Example 7.

However, in Comparative Example 4 and Comparative Example 5 where the heating temperature was low in a range of about 200° ° C. to about 150° C., it was confirmed that the organic content was low, the aggregation rate was higher than or equal to about 15%, and the surface of the thin film was uneven as shown in FIGS. 8 and 9. In Comparative Example 4 and Comparative Example 5, the current efficiency was less than or equal to about 60% of the current efficiency of Example 1, so it was confirmed that the current efficiencies of Comparative Example 4 and Comparative Example 5 were not good. Through this, it was confirmed that in case that the heating temperature for the formation of metal thiolate carboxylate is higher than or equal to about 230° C. or more, a remarkable effect may be obtained.

Example 1 and Example 2 used oleic acid and 1-dodecanethiol, but a same or similar effects may be obtained even in case that other carboxylic acids and other thiols are used. Hereinafter, another embodiment will be described.

Example 3

In Example 3, palmitic acid was used instead of oleic acid.

Example 4

In Example 4, lauric acid was used instead of oleic acid.

Example 5

In Example 5, stearic acid was used instead of oleic acid.

Example 6

In Example 6, octanethiol was used instead of 1-dodecanethiol.

Example 7

In Example 7, hexanethiol was used instead of 1-dodecanethiol.

The quantum dot light-emitting layers of Example 3 to Example 7 and the quantum dot light-emitting layer of Example 1 of Table 1 were formed by a same method, and the results are shown in Table 4 below.

TABLE 4

| ETL (lower film) | EML (upper film) | Ligand (Zn thiolate carboxylate) | Thiolate source | Carboxylate source | Organic content | Aggregation rate |
|---|---|---|---|---|---|---|
| ZnMgO | QD | Example 1 | dodecanethiol | Oleic acid | about 13.8% | about 4% |
| | | Example 3 | dodecanethiol | Palmitic acid | about 13.2% | about 2% |
| | | Example 4 | dodecanethiol | Lauric acid | about 13.3% | about 2% |
| | | Example 5 | dodecanethiol | Stearic acid | about 14.0% | about 4% |
| | | Example 6 | octanethiol | Oleic acid | about 13.5% | about 2% |
| | | Example 7 | hexanethiol | Oleic acid | about 13.6% | about 5% |

Referring to Table 4, it was confirmed that Example 3 to Example 7 using other thiols or other carboxylic acids also showed a high organic content, a low aggregation rate, and a uniform deposition surface as in Example 1 as shown in FIGS. 10 to 14. Hereinafter, a display device including the light-emitting device according to an embodiment will be described with reference to the drawings.

Figure 15:
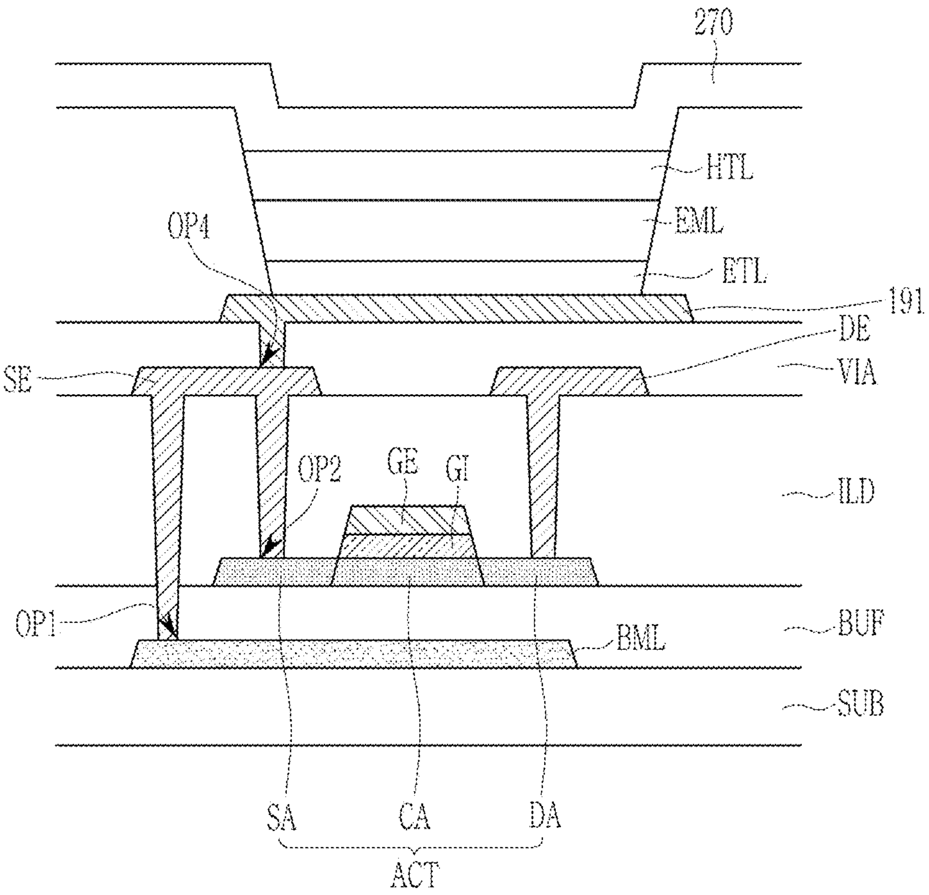
FIG. 15 is a schematic cross-sectional view of a display device including a light-emitting device according to an embodiment.

FIG. 15 is a schematic cross-sectional view of a display device including a light-emitting device according to an embodiment. FIG. 15 schematically illustrates a portion of a cross-section of the display device including the light-emitting device for better understanding and ease of description, but the disclosure is not limited thereto.

Referring to FIG. 15, a substrate SUB may be disposed. The substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate SUB may be a rigid substrate, or a flexible substrate that is bendable, foldable, or rollable. The substrate SUB may be single-layered or multi-layered. The substrate SUB may include sequentially stacked at least one base layer including a polymer resin and at least one inorganic layer, which are alternately stacked each other.

A light blocking layer BML may be disposed on the substrate SUB. The light blocking layer BML may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), a metal oxide, or a combination thereof, and may have a single-layered or multi-layered structure including at least one of aluminum (Al), silver (Ag), magnesium (Mg), gold (Au), nickel (Ni), chromium (Cr), calcium (Ca), molybdenum (Mo), titanium (Ti), tungsten (W), and/or copper (Cu), a metal oxide, or a combination thereof.

A buffer layer BUF may be disposed on the light blocking layer BML and substrate SUB. The buffer layer BUF may include a silicon oxide ($SiO_x$), a silicon nitride ($SiN_x$), a silicon oxynitride ($SiO_xN_y$), amorphous silicon (Si), or the like.

The buffer layer BUF may include a first opening OP1 overlapping the light blocking layer BML in a plan view. A source electrode SE may be connected to the light blocking layer BML through the first opening OP1.

A semiconductor layer ACT may be disposed on the buffer layer BUF. The semiconductor layer ACT may include polycrystalline silicon. The semiconductor layer ACT may include a channel area CA overlapping a gate electrode GE in a plan view, and a source area SA and a drain area DA disposed at sides of the channel area CA.

A gate insulating film GI may be disposed on the semiconductor layer ACT. The gate insulating film GI may include a silicon oxide ($SiO_x$), a silicon nitride ($SiN_x$), and a silicon oxynitride ($SiO_xN_y$), and may have a single-layered or multi-layered structure including the silicon oxide ($SiO_x$), the silicon nitride ($SiN_x$), and the silicon oxynitride ($SiO_xN_y$).

The gate insulating film GI may be disposed to overlap the channel area CA of the semiconductor layer ACT in a plan view. A gate conductive layer including the gate electrode GE may be disposed on the gate insulating film GI. The gate conductive layer may include molybdenum (Mo), aluminum (Al), copper (Cu), titanium (Ti), a metal oxide, or a combination thereof, and may have a single layered or multi-layered structure including molybdenum (Mo), aluminum (Al), copper (Cu), titanium (Ti), a metal oxide, or a combination thereof.

The gate electrode GE and the gate insulating film GI may be formed in a same process to have a same shape in a plan view. The gate electrode GE may be disposed to overlap the semiconductor layer ACT in a direction perpendicular to a surface of the substrate SUB.

An interlayer insulating film ILD may be disposed on the semiconductor layer ACT and the gate electrode GE. The interlayer insulating film ILD may include a silicon oxide ($SiO_x$), a silicon nitride ($SiN_x$), and a silicon oxynitride ($SiO_xN_y$), and may have a single-layered or multi-layered structure including the silicon oxide ($SiO_x$), the silicon nitride ($SiN_x$), and the silicon oxynitride ($SiO_xN_y$). In case that the interlayer insulating film ILD has a multi-layered structure including a silicon nitride ($SiN_x$) and a silicon oxide ($SiO_xN_y$), a layer including the silicon nitride ($SiN_x$) may be disposed closer to the substrate SUB than a layer including the silicon oxide ($SiO_xN_y$).

The interlayer insulating film ILD may include a first opening OP1 overlapping the light blocking layer BML in a plan view, a second opening OP2 overlapping the source area SA of the semiconductor layer ACT in a plan view, and a third opening OP3 overlapping the drain area DA of the semiconductor layer ACT in a plan view.

A data conductive layer including the source electrode SE and a drain electrode DE may be disposed on the interlayer insulating film ILD. The data conductive layer may include aluminum (Al), silver (Ag), magnesium (Mg), gold (Au), nickel (Ni), chromium (Cr), calcium (Ca), molybdenum (Mo), titanium (Ti), tungsten (W), copper (Cu), a metal oxide, or a combination thereof and may have a single-layered or multi-layered structure including aluminum (Al), silver (Ag), magnesium (Mg), gold (Au), nickel (Ni), chromium (Cr), calcium (Ca), molybdenum (Mo), titanium (Ti), tungsten (W), copper (Cu), a metal oxide, or a combination thereof.

The source electrode SE may contact the light blocking layer BML at the first opening OP1, and may contact the source area SA of the semiconductor layer ACT at the second opening OP2. The drain electrode DE may contact the drain area DA of the semiconductor layer ACT at the third opening OP3.

An insulating film VIA may be disposed on the data conductive layer. The insulating film VIA may include an organic insulating material such as a general purpose polymer such as polymethylmethacrylate (PMMA), polystyrene (PS), and the like, a polymer derivative having a phenolic group, an acryl-based polymer, an imide-based polymer, a polyimide, a siloxane-based polymer, and the like.

The insulating film VIA may include a fourth opening OP4 overlapping the source electrode SE in a plan view. The first electrode 191 may be disposed on the insulating film VIA. The electron transport layer ETL, the light-emitting layer EML, the hole transport layer HTL, and the second electrode 270 may be disposed on the first electrode 191. The electron transport layer ETL, the light-emitting layer EML, the hole transport layer HTL, and the second electrode 270 disposed on the first electrode 191 may configure a light-emitting device (LED), and a detailed description of the light-emitting device is omitted as the detailed description of the light-emitting device and described above is the same as described above.

The light-emitting layer EML may include quantum dots surface treated with metal thiolate carboxylate ligands. The metal may be at least one of In, Zn, Mg, Ti, Ga, Al, Sn, Cu, and Ag. The thiolate may be at least one of methane thiol, ethane thiol, propane thiol, butane thiol, pentane thiol, hexane thiol, octane thiol, dodecane thiol, hexadecane thiol, octadecane thiol, and benzyl thiol. The carboxylate may be at least one of a methane acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light-emitting device comprising:
a first electrode;
an electron transport layer disposed on the first electrode;
a light-emitting layer disposed on the electron transport layer;
a hole transport layer disposed on the light-emitting layer; and
a second electrode disposed on the hole transport layer, wherein
the light-emitting layer includes quantum dots, and
metal thiolate carboxylate complexes are disposed as ligands on surfaces of the quantum dots.

2. The light-emitting device of claim 1, wherein a metal in the metal thiolate carboxylate complexes is at least one of In, Zn, Mg, Ti, Ga, Al, Sn, Cu, and Ag.

3. The light-emitting device of claim 1, wherein a thiolate in the metal thiolate carboxylate complexes is at least one of methane thiol, ethane thiol, propane thiol, butane thiol, pentane thiol, hexane thiol, octane thiol, dodecane thiol, hexadecane thiol, octadecane thiol, and benzyl thiol.

4. The light-emitting device of claim 1, wherein a carboxylate in the metal thiolate carboxylate complexes is at least one of a methanoic acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid.

5. The light-emitting device of claim 1, wherein the electron transport layer includes at least one of ZnO, $TiO_2$, $WO_3$, $SnO_2$, and ZnO, $TiO_2$, $WO_3$, and $SnO_2$ doped with at least one of Mg, Y, Li, Ga, and Al.

6. The light-emitting device of claim 5, wherein the electron transport layer includes a hydroxyl group or ethylene glycol.

7. The light-emitting device of claim 1, wherein the quantum dot includes a group III-V nano-semiconductor compound.

8. The light-emitting device of claim 7, wherein the quantum dot includes at least one of GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

9. The light-emitting device of claim 1, wherein
the first electrode is a reflective electrode, and
the second electrode is a transflective electrode.

10. A display device comprising:
a transistor disposed on a substrate; and
a light-emitting device electrically connected to the transistor, wherein
the light-emitting device includes:
a first electrode;
an electron transport layer disposed on the first electrode;
a light-emitting layer disposed on the electron transport layer;
a hole transport layer disposed on the light-emitting layer; and
a second electrode disposed on the hole transport layer,
the light-emitting layer includes quantum dots, and
metal thiolate carboxylate complexes are disposed as ligands on surfaces of the quantum dots.

11. The display device of claim 10, wherein the transistor is electrically connected to the first electrode of the light-emitting device.

12. The display device of claim 10, wherein a metal in the metal thiolate carboxylate complexes ligands is at least one of In, Zn, Mg, Ti, Ga, Al, Sn, Cu, and Ag.

13. The display device of claim 10, wherein a thiolate in the metal thiolate carboxylate complexes is at least one of methane thiol, ethane thiol, propane thiol, butane thiol, pentane thiol, hexane thiol, octane thiol, dodecane thiol, hexadecane thiol, octadecane thiol, and benzyl thiol.

14. The display device of claim 10, wherein a carboxylate in the metal thiolate carboxylate complexes is at least one of a methanoic acid, an ethanoic acid, a propanoic acid, a butanoic acid, a pentanoic acid, a hexanoic acid, a heptanoic acid, an octanoic acid, a dodecanoic acid, a lauric acid, a hexadecanoic acid, an octadecanoic acid, an oleic acid, a benzoic acid, a palmitic acid, and a stearic acid.

15. The display device of claim 10, wherein the electron transport layer includes at least one of ZnO, $TiO_2$, $WO_3$ $SnO_2$, and ZnO, $TiO_2$, $WO_3$, and $SnO_2$ doped with at least one of Mg, Y, Li, Ga, and Al.

16. The display device of claim 10, wherein
the first electrode is a reflective electrode, and
the second electrode is a transflective electrode.

* * * * *